US005181000A

United States Patent [19]

Smith

[11] Patent Number: 5,181,000

[45] Date of Patent: Jan. 19, 1993

[54] DIGITAL INTERFERENCE FILTER FOR AUDIO SYSTEMS

[75] Inventor: Lawrence C. Smith, Lynbrook, N.Y.

[73] Assignee: Perfectionist Audio Components Inc., Malverne, N.Y.

[21] Appl. No.: 822,864

[22] Filed: Jan. 21, 1992

[51] Int. Cl.5 .............................................. H03H 7/00

[52] U.S. Cl. .................................... 333/181; 333/185; 333/12

[58] Field of Search ............... 333/181, 182, 183, 184, 333/185, 167, 172, 12, 170, 202, 243; 361/56

[56] References Cited

U.S. PATENT DOCUMENTS 3,697,896 10/1972 Sarkozi et al. ........................ 333/12
5,015,975 5/1991 Okubo ................................ 333/181

*Primary Examiner*—Paul M. Dzierzynski
*Assistant Examiner*—Ali Neyzari
*Attorney, Agent, or Firm*—Mark T. Basseches; Paula T. Basseches

[57] ABSTRACT

A device for blocking high frequency noise components present in the ground circuits of digital devices from transmission to the amplification devices of an audio system comprises a conductive enclosure having input leads for connection to the positive and ground circuits of a digital device and an external output receptacle. An inductor within the enclosure is in series connection between the input ground lead and an output wire and filters the high frequency noise. An androgenous jack coupled to the ground lead couples the positive circuit and the filtered ground circuit to the amplifier.

2 Claims, 1 Drawing Sheet

DIGITAL INTERFERENCE FILTER FOR AUDIO SYSTEMS

BACKGROUND OF THE INVENTION

1. Field of the Invention

The present invention is directed to an apparatus for filtering high frequency products generated by and present in the ground circuits of digital devices such as CD players.

More particularly, the invention is directed to a filter for use in high accuracy audio systems for eliminating high frequency products present in the ground circuit of the digital device from being transmitted to the amplification circuitry.

2. The Prior Art

It is known that digital devices employing "clock" circuits are a source of high frequency products which, while above the audible range, modulate the audible frequencies producing harmonics which degrade the accuracy of reproduction of audible signals.

In my copending application Ser. No. 07-700,394, now U.S. Pat. No. 5,115,368, there is disclosed an AC power strip for use with a device incorporating digital switching circuitry such as a CD player or DAT recorder, which isolates amplification equipment etc. from digitally generated high frequency products injected into the mains line by the digital circuitry. I have determined that substantial additional degradation of reproduced sound occurs as a result of high frequency products from digital sources being conducted from the digital source to amplification equipment via the interconnects linking such components.

More particularly, while the "positive" or "hot" signals of digital equipments are generally free of noise generated by the digital device, the ground circuits are replete with such noise components.

While some of the latest high fidelity componentry employs so-called "balanced" interconnect systems wherein both the positive and negative leads are isolated from ground circuitry and thus from digital noise, the vast majority of currently available equipment does not employ balanced technology, with resultant transmission via interconnects of the digital noise products.

SUMMARY OF THE INVENTION

The present invention may be summarized as directed to a digital interference filter which eliminates the transmission from a digital device to the amplification unit of a high fidelity system of the noise products generated by a digital source.

More particularly, the invention is related to a device which is retrofittable to conventional interconnects employing so-called RCA connectors or the like whereby the ground or negative circuit exiting the digital source is filtered so as to eliminate digital noise products from being passed to the amplification system.

In accordance with the invention an enclosure, preferably of conductive metal, defining a shield, houses an inductor. The ground or "negative" lead from the digital source is passed through the inductor to a conductor, which is in turn connected to the ground lead of an androgenous interconnect jack (as hereinafter defined).

The positive lead of the digital source is connected to the positive terminal of a receptacle mounted on the enclosure and thence to the androgenous jack via a conventional interconnect. The jack conducts the "positive" lead and the filtered negative lead to the amplification systems. The shield (negative lead) of the interconnect is in turn grounded to the conductive enclosure, thus linking the negative circuitry of the amplification system to the enclosure.

From this arrangement, it will be appreciated that digital noise in the ground of the digital device is totally isolated from the negative or ground circuit of the amplification system by an inductance blocking transmission of high frequency products.

It will be further appreciated that since the device permits the use of conventional interconnects it is retrofittable to the vast majority of digital sources and amplification devices.

It is accordingly an object of the invention to provide a filtering device for blocking the transfer of high frequency products present in the ground circuits of digital devices from transmission to the amplification system.

It is a further object of the invention to provide a device of the type described which is readily retrofittable as an external accessory to the vast majority of digital and amplification components currently available.

DEFINITION

As used herein the term androgenous jack is intended to refer to a jack having at one end male terminals intended to couple to the conventional female receptacle of an amplification device (or control component connected to an amplification device) and at its other end a female receptacle adapted to receive the male terminals of a conventional interconnect.

While it is recognized that is the vast majority of cases the interconnect employed, and hence the male and female components of the androgenous jack, will in practice be conventional RCA connectors, the invention is not limited to the use of such connectors.

DETAILED DESCRIPTION OF THE DRAWINGS

Figure 1:
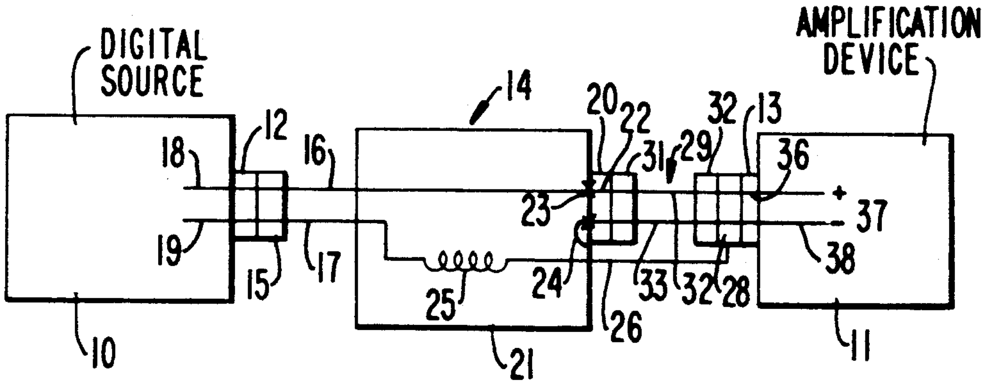
FIG. 1 is a schematic diagram of the circuitry of the device.
Figure 2:
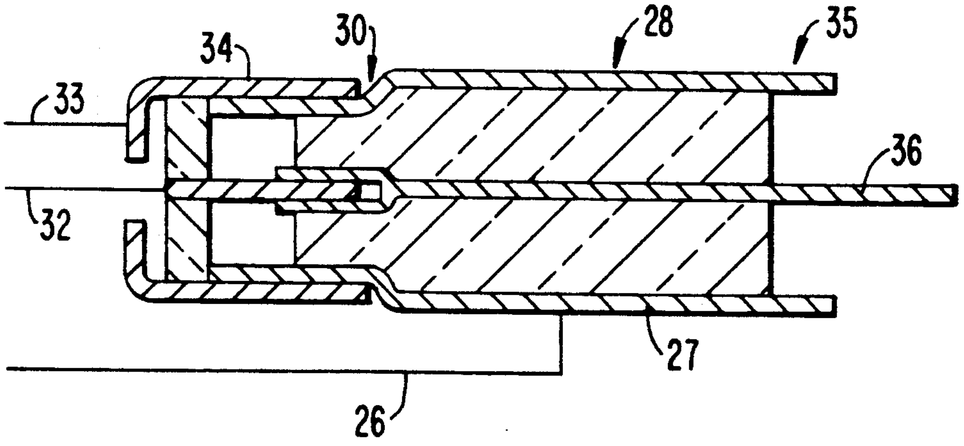
FIG. 2 is an enlarged schematic sectional view of the androgenous jack component.

Referring now to the drawings, there is disclosed in FIG. 1 a digital source 10 such as a CD player or DAT recorder and an amplification device 11. Typically the digital source and amplification device operate stereophonically and thus would include duplicate outputs and inputs, respectively for the left and right channels.

Since the circuitry is identical for each channel the circuitry of only a single channel is illustrated for purposes of simplicity.

The digital source includes an output jack 12 and the amplification device includes an input jack 13, the jacks 12 and 13 typically comprising female RCA receptacles. In normal practice the devices 10 and 11 are coupled by an interconnect comprising two conductors terminated by male RCA plugs. It is between the jacks 12 and 13 that the digital filtering apparatus 14 is interposed.

The device 14 includes an input plug member 15 having a positive lead 16 and a ground lead 17 coupled, respectively to the positive and ground leads 18, 19 of the digital source.

An output receptacle 20 is mounted on enclosure 21 of filtering device 14. Preferably enclosure 21 is comprised of a conductive metal forming a shield.

The positive lead 16 is connected to the positive terminal of receptacle 20. The negative terminal 23 of the receptacle is connected, as by jumper 24, to the conductive enclosure 21.

An inductor 25 is mounted within the enclosure and interposed in series between negative input lead 17 and external conductor 26 leading to the shield or jacket 27 forming the ground lead of the androgenous jack 28. A conventional interconnect 29 couples the output receptacle 20 of the filter to the female end 30 of the androgenous jack 28.

More particularly, the interconnect 29 includes a first plug 31 at one end mating with receptacle 20 and including a positive lead 32 coupled to positive lead 16 and negative lead 33 which, via jumper 24, is connected to the enclosure 21.

The other end 34 of the interconnect 29 is connected to the female end 30 of the jack 28, the male end 35 of the jack being coupled to receptacle 13, whereby the positive circuitry is coupled via male probe 36 to the positive circuitry 37 of the amplification device.

Importantly, the ground lead 19 of digital source 10 will be coupled to the negative input lead 38 of the amplification device 11 solely via a circuit path leading through inductor 25 and conductor 26.

The inductor comprises a choke, e.g. of 100 millihenry value, providing a low resistance wide-bandwidth path to frequencies within and well beyond the audible range, but a high impedance path to frequencies in the MHz range where digital noise is located.

The device is readily retrofittable to existing audio componentry, requiring no wiring changes or alterations to the circuits of the linked components.

The device has been tested and found to result in a materially smoother and more detailed rendition of sound emanating from digital sources than results when the digital source is conventionally coupled to the amplification circuitry.

Unlike band-width limiting filters which are inserted in the signal path, the instant device avoids the degradation inherent in such filters.

As interesting and as yet unexplained phenomenon observed with the use of the filter is that sonic differences experienced when using various types of interconnects appear to be reduced.

As will be apparent to those skilled in the art and familiarized with the instant disclosure, numerous changes may be made in details of construction without departing from the spirit of the invention. Accordingly, the invention is to be broadly construed within the scope of the appended claims.

Having thus described the invention and illustrated its use, what is claimed as new and is desired to be secured by Letters Patent is:

1. A filter device for blocking transmission from a digital source to the amplification device of an audio system of high frequency components generated by and present in the ground circuits of said source comprising a conductive enclosure forming a shield, an input connector secured to said enclosure and having positive and ground leads adapted to be connected to the positive and ground outputs respectively of said source, said leads being electrically isolated from said enclosure, an output connector mounted on said enclosure and including a positive terminal connected to said positive lead of said input connector and a ground terminal connected to said enclosure, a ground conductor extending and electrically isolated from said enclosure, an inductor mounted in said enclosure in series connection between said ground lead of said input connector and said ground conductor, and jack means electrically connected to said ground conductor for electrically coupling said ground conductor to the ground of the amplification device, whereby said ground conductor forms the sole connection between the ground output of said source and said ground of said amplification device.

2. A device in accordance with claim 1 wherein said jack means is androgenous and includes a female end for receiving an interconnect coupled to said output connector and a male end for electrically coupling said jack means to said amplification device.

* * * * *